(12) United States Patent
Braun et al.

(10) Patent No.: US 8,106,300 B2
(45) Date of Patent: Jan. 31, 2012

(54) SPLIT FLEX CABLE

(75) Inventors: David J. Braun, St. Charles, MN (US); Mark G. Clark, Rochester, MN (US); John R. Dangler, Rochester, MN (US); Matthew S. Doyle, Rochester, MN (US); Thomas D. Kidd, Stewartville, MN (US); Jason T. Stoll, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 570 days.

(21) Appl. No.: 12/244,216

(22) Filed: Oct. 2, 2008

(65) Prior Publication Data

US 2010/0084160 A1 Apr. 8, 2010

(51) Int. Cl.
*H01B 7/08* (2006.01)
(52) U.S. Cl. .................................. 174/117 F
(58) Field of Classification Search ............... 174/117 F, 174/250, 261, 117 FF
See application file for complete search history.

(56) References Cited

U.S. PATENT DOCUMENTS

2007/0064402 A1* 3/2007 Schumacher ................. 361/785
2010/0091539 A1* 4/2010 Bang et al. ..................... 365/51

OTHER PUBLICATIONS

"Modified VHDM connectors and modular flexible circuitry allowing for increased design flexibility and manufacturability," IBM, Jun. 14, 2004, http://www.ip.com/pubview/IPCOM000029050D.

* cited by examiner

*Primary Examiner* — Chau Nguyen
(74) *Attorney, Agent, or Firm* — Rabin & Berdo, P.C.

(57) ABSTRACT

A cable assembly for interconnecting a plurality of circuit boards together by using a connector assembly connected to each of the circuit boards. The cable assembly includes a first cable having a first end part and a second cable having a second end part. A first periphery of the first end part has a plurality of first half vias that collectively form a column along a width direction of the connector assembly. A second periphery of the second end part has a plurality of second half vias that collectively form a column along the width direction of the connector assembly. The first and second end parts are coupled together to form a connecting unit, such that the first half vias and the second half vias are joined together to form full vias.

22 Claims, 13 Drawing Sheets

SPLIT FLEX CABLE

BACKGROUND OF THE INVENTION

1. Field of the Invention

The invention relates to a flex cable for interconnecting together a plurality of printed circuit boards through a connector assembly, and in particular, to a split flex cable that is coupled to the connector assembly, thereby providing an increased electrical performance and enhanced mechanical flexibility.

2. Background Information

Cables typically are coupled with an electronic connector assembly at opposing ends that are matable with a printed circuit board of electronic devices. Such a cable connector assembly is well known in the connector assembly art and includes a universal serial bus (USB)-type connector assembly, a parallel connector assembly, a serial connector assembly, a VHDM (very high density metric) connector assembly, and the like. The VHDM connector assembly may be used for a high-density connection between electronic devices.

In computer systems, for example, flex cables having connector assemblies at each end are utilized for a high-speed interconnection between a first circuit board assembly and a second circuit board assembly. However, when a single flex cable interconnects more than two circuit boards, the end of the flex cable should be understood to mean each portion of the flex cable that is connected to each printed circuit board through the VHDM connector assembly.

FIG. 1 illustrates a conventional flexible or flex cable incorporated with VHDM connector assemblies for interconnecting two circuit boards. A flex cable 10 and two connector assemblies 12a and 12b (hereafter may be referred to as 12 for simplicity) jointly interconnect together a first circuit board 14 and a second circuit board 16. Each of the circuit boards 14 and 16 may be a portion of a separate computer system. The connector assembly 12, for example a VHDM connector assembly, is electrically and mechanically coupled to connecting portions of the flex cable 10 through vias, such as by soldering or the like.

FIG. 2 is a schematic plan view of a conventional VHDM connector assembly. The VHDM connector assembly 12 has signal pins that are schematically shown from a plan view of the VHDM connector assembly 12 and labeled by a row designation (A-H) and a column designation (1–N). These signal pins are connected to the flex cable 10 and also received in sockets (not shown) of corresponding mating connectors (not shown) on the circuit boards 14 and 16. The connector assembly 12 has a limited number of signal pins arranged along a width direction W of the connector assembly 12, and thus has a predetermined number of rows (e.g., eight rows in FIG. 2). In contrast, the VHDM connector assembly 12 may have, in its length direction L, as many columns of signal pins as required.

Each column of signal pins is separated from adjacent columns of signal pins by ground shield GS. Each ground shields GS has a predetermined number of ground shield solder tails or ground pins (not shown) that are arranged along the width direction W of the connector assembly 12. The connector assembly with eight-row signal pins conventionally has seven rows of ground pins shown as dotted circles in FIG. 2.

The signal pins and ground pins of the connector are inserted into corresponding vias of the flex cable that are arranged in a pattern that the pins of the VHDM connector assembly 12 can be inserted into to the vias.

Each connecting portion 110 and 120 of the flex cable 10 has a plurality of signal vias and a plurality of ground vias. For example, as shown in FIG. 3, the connecting portion 110 has eight signal vias A-H in each signal column and seven ground vias J-P in each ground column, so as to correspond to the pins of the VHDM connector assembly 12. The signal column and ground column are alternately disposed and respectively extend along a width direction of the flex cable 10.

Conventionally, a VHDM connector assembly is connected to only one single connecting portion of a flex cable that extends and integrally formed in its length direction L. FIG. 4 shows the flex cable 10 and the VHDM connector assemblies 12 of FIG. 1 with the flex cable 10 and connector assemblies being connected to each other. The VHDM connector assembly 12a is coupled only to a first connecting portion 110 of the flex cable 10, and the VHDM connector assembly 12b is coupled only to a second connecting portion 120 of the flex cable 10. Each connecting portion 110 and 120 is integrally formed in its length direction. Accordingly, the single flex cable 10 interconnects the two circuit boards 14 and 16 through the connector assemblies 12a and 12b.

In case of a complex system, more pins are required in the VHDM connector assembly, and a large number of vias and a large length of signal wirings are required in the flex cable, resulting a significant increase in the width of the flex cable or in the number of layers on a flex cable.

For example, if four busses B1 to B4 of signal lines are required to interconnect the two circuit boards 14 and 16 as shown in FIG. 4, these four bus lines B1 to B4 should be included in the single flex cable 10. Each buses may be comprised of a plurality of line, e.g., 16 lines. The number of bus lines that could run on one signal layer of the flex cable 10 varies depending on the number of signals in a bus line and the allowable overall width of cable. The number of lines that could run on a single layer also depends on a width of each line and a line-to-line spacing, both of which have signal integrity and manufacturability limit. For example, so as to dispose all of the busses B1 to B4 on a single layer, a width of the cable WC1 should be increased accordingly. However, such an increased width WC1 may exceed the allowable overall width of the flex cable, increase the manufacturing cost, and reduce the flexibility of the flex cable.

Alternatively, the bus lines B1 to B4 of the flex cable 10 may be disposed on two or more separate signal layers of the flex cable based on the signal amounts and the constraint for the overall width of cable. However, this configuration also requires increased number of layers in a single flex cable. A higher number of layers on flex cables increase cost, negatively affect manufacturability and reliability, and result in more stiff cables that do not meet flexibility or other mechanical packaging requirements.

FIG. 5 illustrates required number of layers for interconnecting a four-drawer system. A single flex cable 50 connects drawer #1 to drawers #3 and #4, and drawer #2 to drawers #3 and #4. The single flex cable 50 includes buses of lines B51 to B54. Each of lines B51 to B54 represent a bus that interconnects drawers #1 and #3, drawers #1 and #4, drawers #2 and #3, and drawers #2 and #4. However, so as to dispose those four bus lines on a single signal layer, the bus B54 necessarily cross the buses B51 and B52, thereby making it impossible to use a cable with a single layer. At least two layers are required in the flex cable 50 for interconnecting the four-drawer system as shown in FIG. 5. This increased number of layers reduces the flexibility of the flex cable. Further, when the flex cable 50 is configured to have an additional layer for the bus B54, the bus B54 necessarily crossover the remaining layer or layers on which other bus or buses are disposed. Thus, the flex cable 50 should have an additional space for such crossovers, resulting an associated bad SI impact on the flex cable 50.

A flex cables that is split along a length direction, e.g., designated by an arrow L in FIGS. 2 and 3, of the VHDM connector assembly has been developed. See "Modified VHDM connectors and modular flexible circuitry allowing for increased design flexibility and manufacturability" at http://www.ip.com/pubview/IPCOM000029050D.

However, when the connecting portion of the flex cable is split in its length direction that is perpendicular to its width direction, each split part of the connecting portion of the flex cable has the same length in the length direction of the connector assembly to which each split part is connected. Thus, each split part should be formed as an integrated element that has the same length as an unsplit connecting portion of the flex cable, thereby limiting design flexibility.

In addition, the conventional VHDM connector assembly 12 is, e.g., on a 2.0×2.25 mm pitch. Accordingly, the vias of the corresponding flex cable 10 has a pitch PL (see FIG. 3) of 2.0 mm in the length direction and a pitch PW (see FIG. 3) of 2.5 mm in the width direction. Accordingly, when the connecting portion of the flex cable 10 is split in the length direction L that is perpendicular to the width direction W, the flex cable 10 is split across the 2.5 mm pitch which is wider than the 2.0 mm pitch, thereby limiting the flexibility of the flex cable.

Moreover, such a flex cable split in its length direction does not give any solution to the layer number increase in the flex cable for connecting a multi-drawer system.

SUMMARY OF THE INVENTION

According to one aspect of the invention, a cable assembly including a split connecting unit is provided. The connecting unit is split into two separate parts, including a first connecting part and a second connecting part. The first connecting part is a portion of a first cable, and the second connecting part is a portion of the second cable. The first cable further includes a main cable portion and another connecting part. The second cable further includes a main cable portion and another connecting part. The first and second cables jointly connect two circuit boards through a connector assembly. The connector assembly may be a VHDM connector assembly. The first and second connecting parts jointly form the connecting unit connected to the connector assembly.

In another exemplary aspect of the invention, the number of buses in the first cable may be the same as or different from the number of buses in the second cable, on condition that the first and second cables jointly include the required total number of buses for the interconnection between the two circuit boards. The buses of each cable may be disposed on the same layer so as to reduce a thickness of each cable, or may be disposed on a plurality of layers so as to meet a width restraint of each cable. Thus, the numbers of layers of the first cable may be the same as or different from that of the second cable. The width of the first cable may be the same as that of the second cable. Further, the main cable portions of the first and second cables can be stacked together in a thickness direction of the cable, so as to reduce a width of the combined cables.

In a further exemplary aspect of the invention, the connecting unit has a split line disposed between the two connecting parts. The split line extends along a width direction of the connecting unit which is the same as the width direction of the connector assembly, and passes through the center of ground vias of one of the ground columns of the connecting unit.

In a further exemplary aspect of the invention, the cable assembly may be configured to run signals to extend from one connecting part to the other connecting part, crossing over the split line e.g., through vias on the split line. The vias may be tied together with solder and disposed in areas without connector assemblies.

In a further exemplary aspect of the invention, the split line may be in a step shape, a zigzag shape, or other suitable shapes. The step-shaped split line may include a first plurality of sub-lines extending along the width direction of the connector assembly and a second plurality of sub-lines extending along the length direction of the connector assembly. The first sub-lines collectively divide the connecting unit of the cable assembly into two separate connecting parts in the width direction. The second sub-lines respectively connect two adjacent first sub-lines. Further, some of the sub-lines may pass through centers of the signal vias, while the remaining sub-lines pass through centers of the ground vias.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper", "lower", "front", "back", "over", "under", and similar such terms are not to be construed as limiting the invention to a particular orientation. Instead, these terms are used only on a relative basis.

Figure 6:
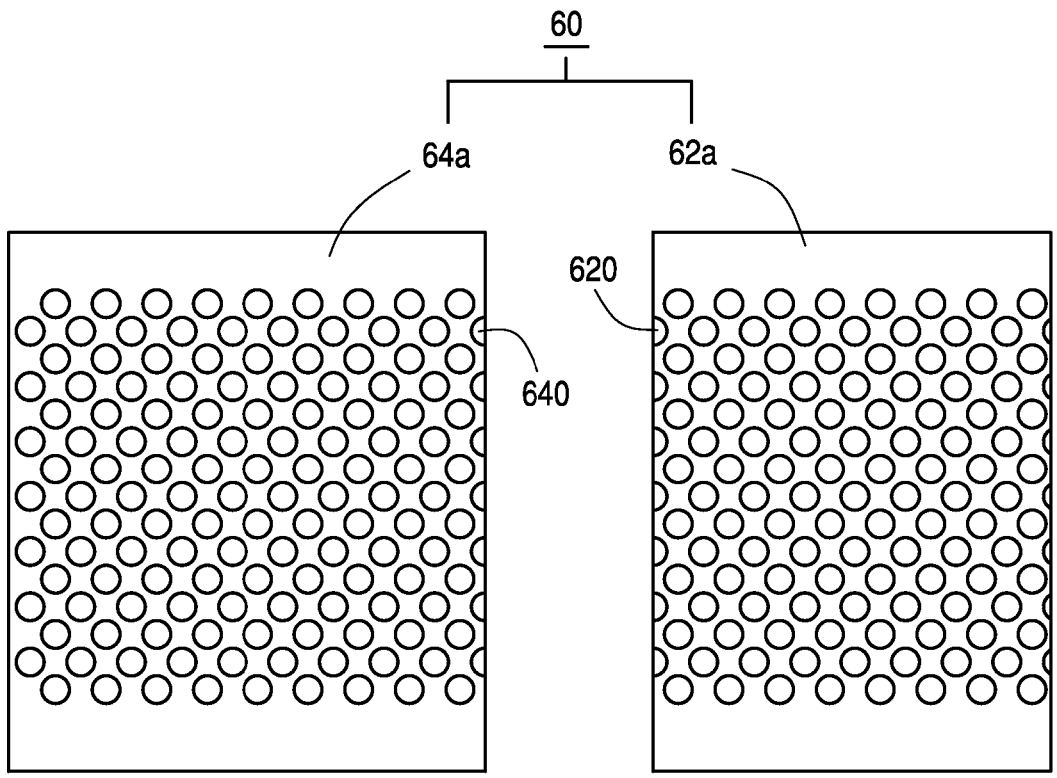
FIG. 6 is a partial plan view of a connecting unit including a first connecting part and a second connecting part, according to an exemplary embodiment of the invention.

FIG. 6 is a partial top plan view of a connecting unit 60 of a cable assembly, according to an exemplary embodiment of the invention. The connecting unit 60 is split into two separate parts, including a first connecting part 62a and a second connecting part 64a.

Figure 1:
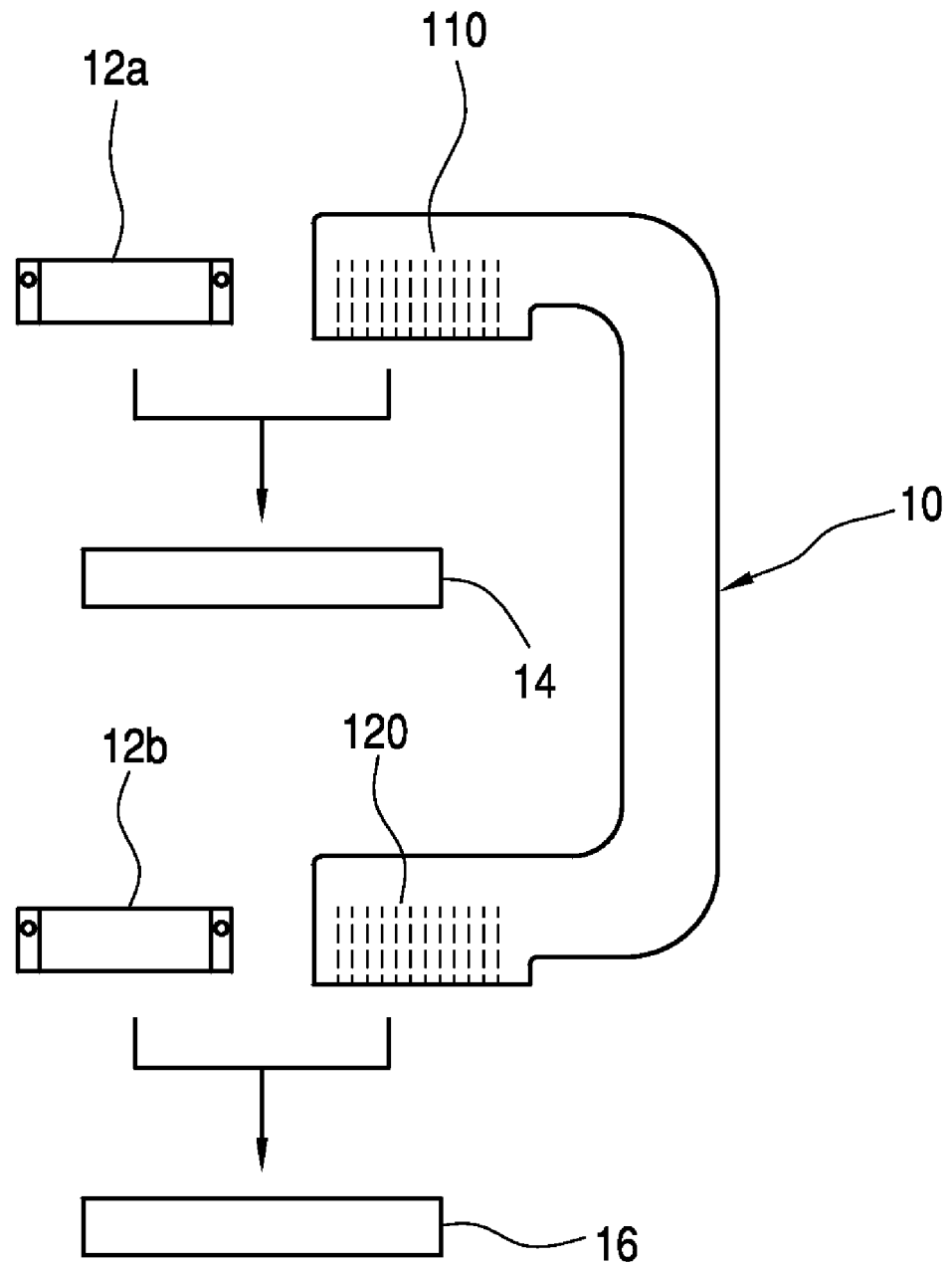
FIG. 1 is a schematic plan view of a conventional flex cable to be incorporated with conventional VHDM connector assemblies for interconnecting two circuit boards.
Figure 7A:
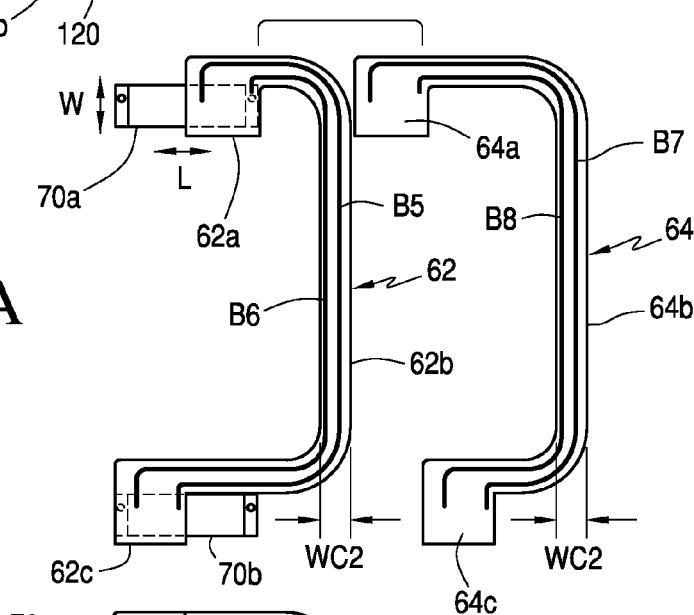
FIGS. 7A and 7B are schematic plan views of a first cable and a second cable jointly forming a cable assembly and the connecting unit shown in FIG. 6.

Because the two connecting parts 62a and 64a are separated from each other, each connecting part may be formed as a portion of a separate cable. As shown in FIG. 7A, the cable assembly of the invention include a first cable 62 and a second cable 64. The first connecting part 62a is a portion of the first cable 62, and the second connecting part 64a is a portion of the second cable 64. The first cable 62 further includes a main cable portion 62b and another connecting part 62c. The second cable 64 further includes a main cable portion 64b and another connecting part 64c. The first and second cables 62 and 64 may jointly interconnect the two circuit boards 14 and 16 (see FIG. 1) through connector assemblies 70a and 70b. The connector assemblies 70a and 70b may be a VHDM connector assembly.

Because the two connecting parts 62a and 62b are separated from each other, each connecting part may be formed as a portion of a separate cable. As shown in FIG. 7A, the cable assembly of the invention include a first cable 62 and a second cable 64. The first connecting part 62a is a portion of the first cable 62, and the second connecting part 64a is a portion of the second cable 64. The first cable 62 further includes a main cable portion 62b and another connecting part 62c. The second cable 64 further includes a main cable portion 64b and another connecting part 64c. The first and second cables 62 and 64 may jointly interconnect the two circuit boards 14 and 16 (see FIG. 1) through connector assemblies 70a and 70b. The connector assemblies 70a and 70b may be a VHDM connector assembly.

Figure 7B:
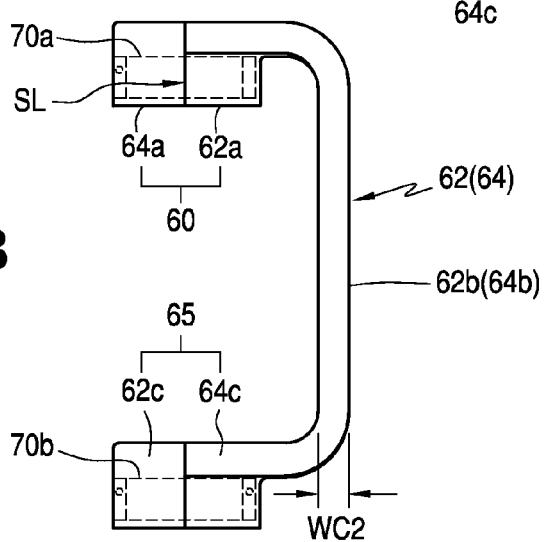
Figure 5:
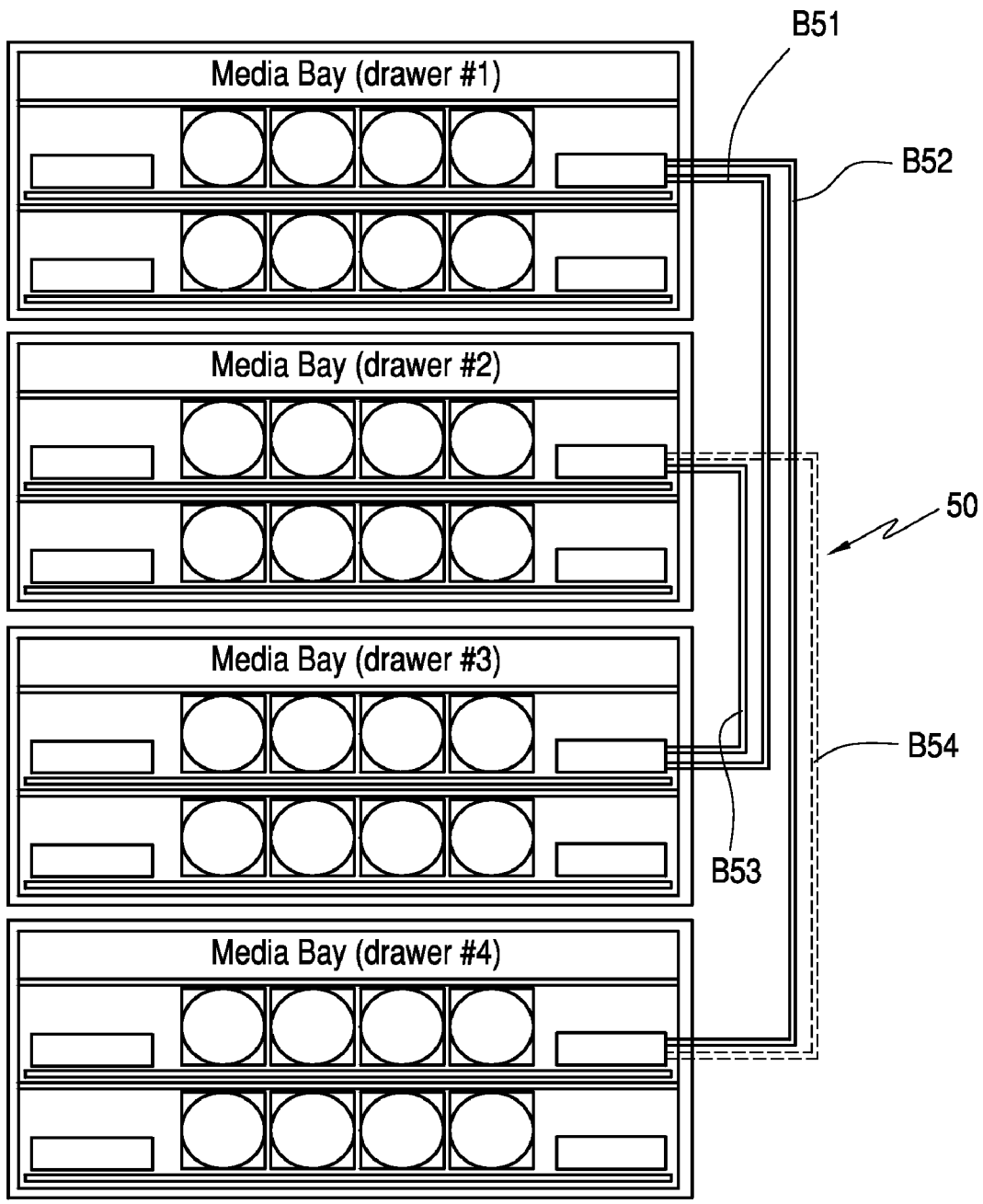
FIG. 5 is a schematic view of the flex cable shown in FIG. 1 connected to a four-drawer system, illustrating required number of layers of the flex cable for interconnecting the four-drawer system.

As shown in FIGS. 7A and 7B, the first connecting part 62a is connected to a right portion of the connector assembly 70a, and the second connecting part 64a is connected to a left portion of the connector assembly 70a. The first and second connecting parts 62a and 64a jointly form the connecting unit 60 matable with the connector assembly 70a. The remaining connecting parts 62c and 64c may be similarly connected to a right portion and a left portion of the connector assembly 70b, and jointly form another connecting unit 65 matable with the connector assembly 70b. The first and second cables 62 and 64 jointly form a cable assembly that interconnects the two circuit boards 14 and 16 together. More specifically, the end portions of first and second cables 62 and 64 jointly form the connecting units 60 and 65, which are respectively matable with the connector assemblies 70a and 70b.

Figure 4:
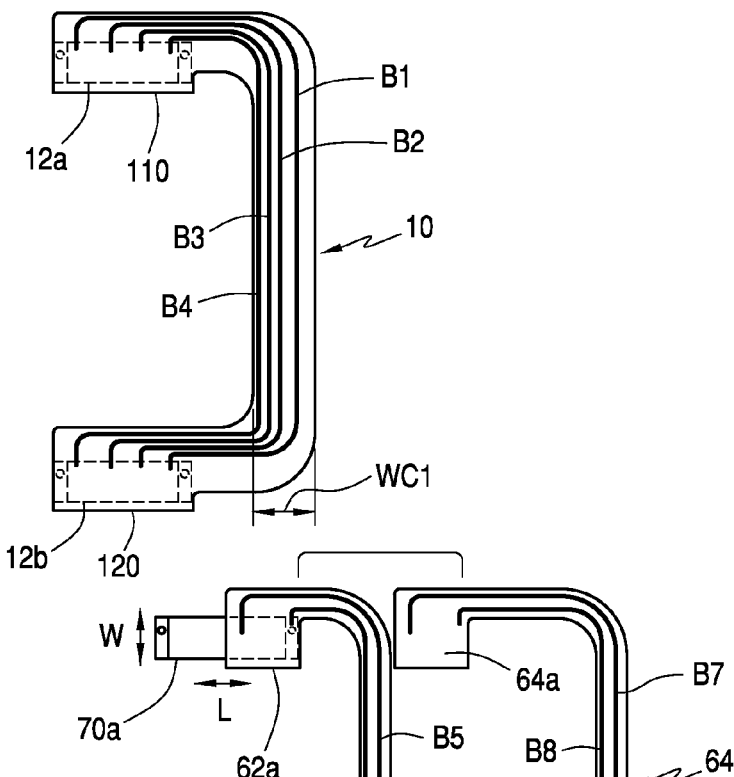
FIG. 4 is a schematic plan view, illustrating the connection of the flex cable and the VHDM connector assemblies shown in FIG. 1.

Four buses are required to connect the two circuit boards 14 and 16, as shown in FIG. 4. Accordingly, in FIGS. 7A and 7B, a combination of the two cables 62 and 64 are needed to have the same total number of buses (i.e., four buses) that are required in FIGS. 7A and 7B. FIG. 7A exemplary illustrates that the first cable 62 has two buses, and the second cable 64 has two buses. Due to the same number of buses therein, the first cable 62 and the second cable 64 may be configured to include the same number of layers. However, the number of buses in each cable may vary as long as the two cables jointly have the required total numbers of buses for the interconnection between the circuit boards. Accordingly, the number of layers in the first cable 62 may be different from those in the second cable 64.

Because each cable 62 and 64 has two buses, each cable 62 and 64 may have a reduced width WC2 (see FIG. 7A) compared with the width WC1 (see FIG. 4) of the cable 10. However, a width of the cable 62 may be different from a width of the cable 64. In addition, as shown in FIG. 7B, the main cable portions 62b and 64b may be stacked together in a thickness direction of the main cable portions, so as to better meet system constraints by reducing the width of a combination of the two cable portions 62a and 64b.

By connecting two systems with multiple cables, each cable may have a reduced number of buses and a reduced width. Further, compared with the conventional cables that may be required to have an increased number of layers to meet the minimum width constraint of the cable, each cable of the invention may have a reduced number of layers. Accordingly, the cable of the invention is more flexible. In addition, each cable may be formed as a modular cable, which is easier to manufacture, thereby improving yields and reducing the manufacturing cost.

Figure 2:
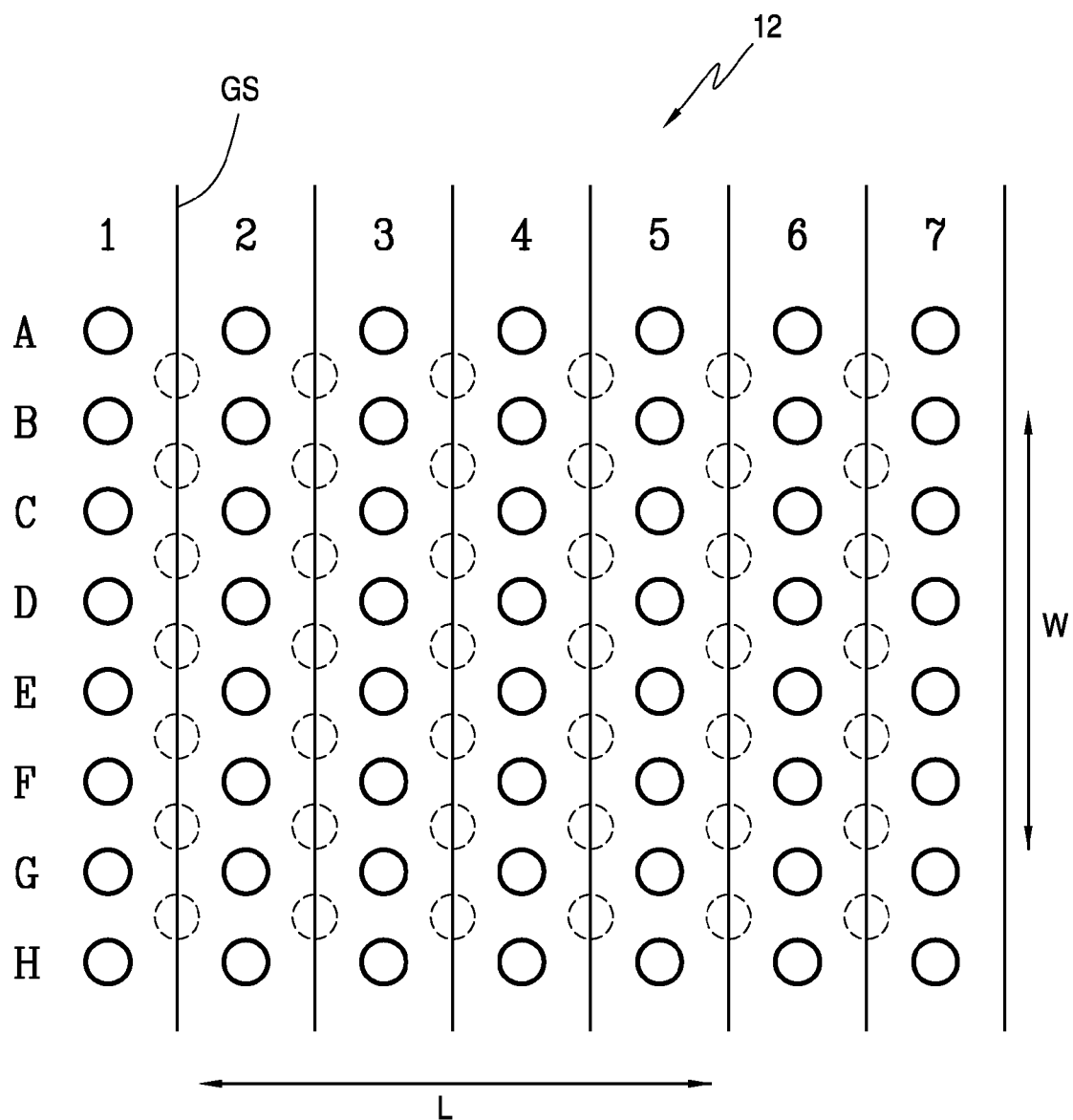
FIG. 2 is a schematic plan view of the conventional VHDM connector assembly shown in FIG. 1.
Figure 3:
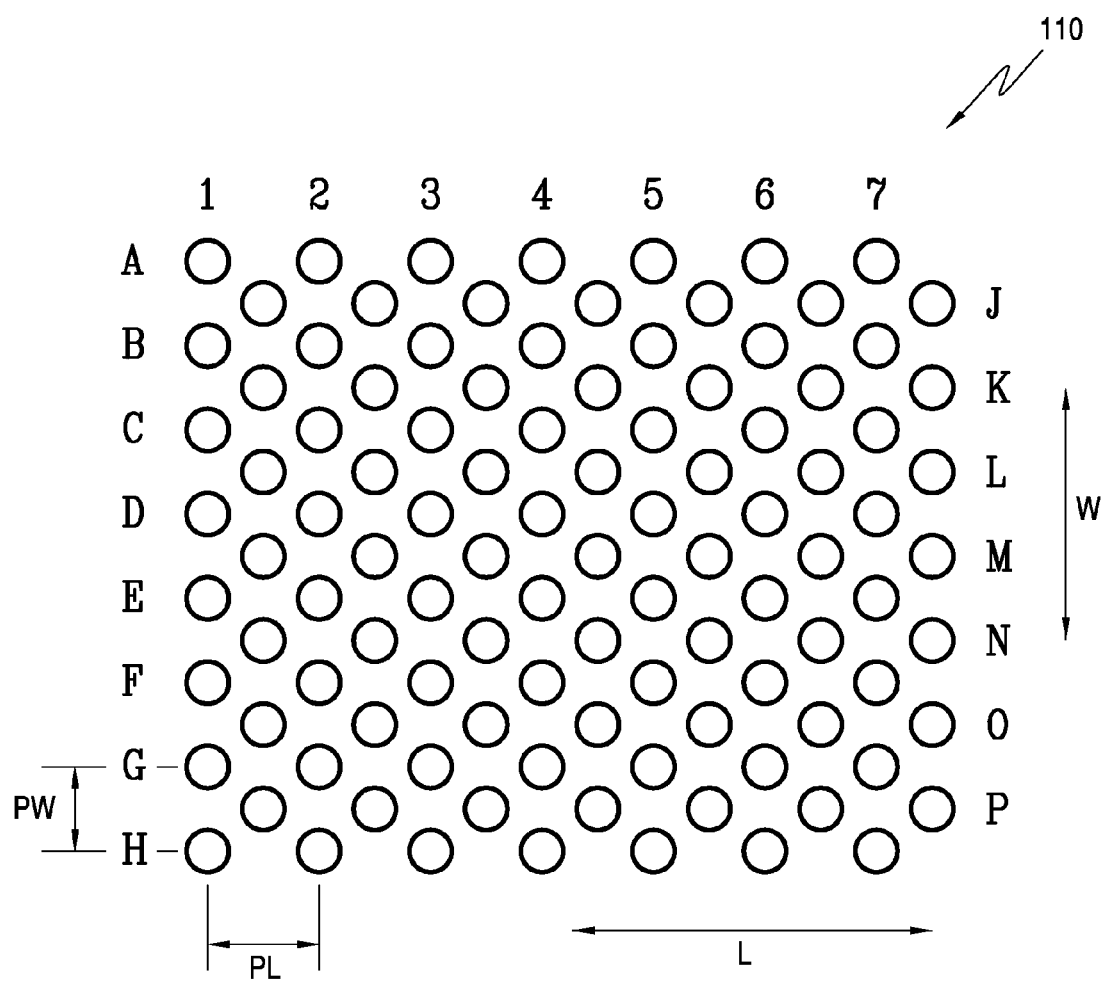
FIG. 3 is a schematic plan view of a connecting portion of the flexible cable shown in FIG. 1.
Figure 8:
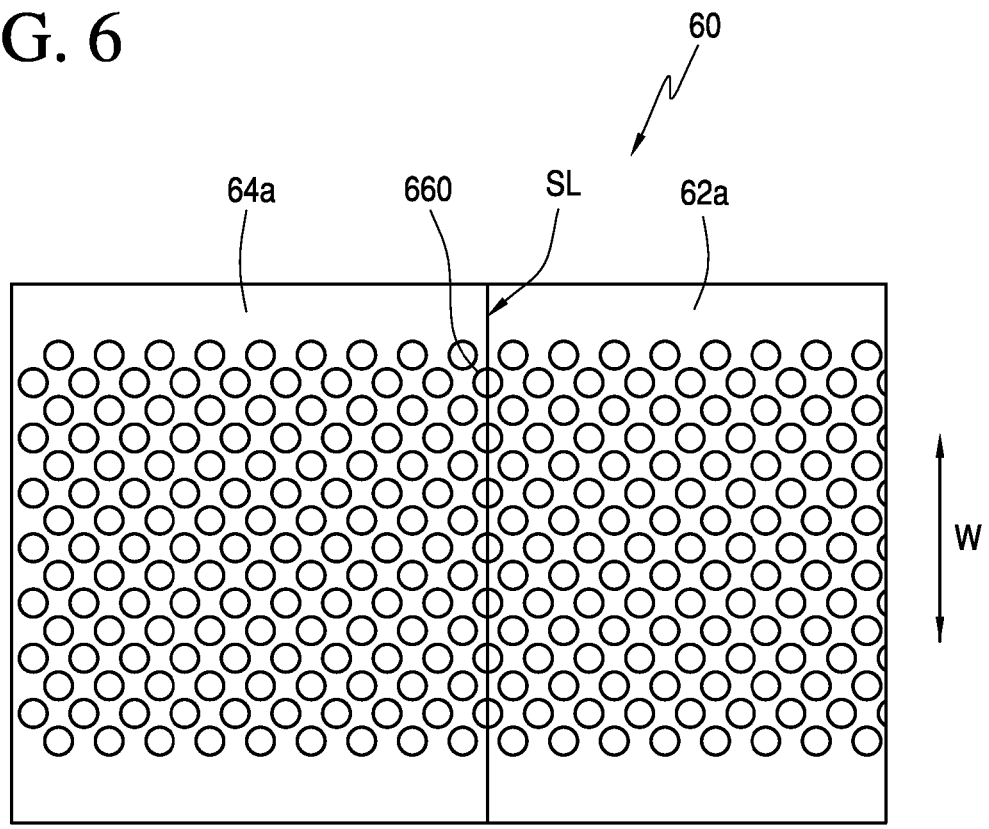
FIG. 8 is a schematic partial plan view of the connecting unit shown in FIG. 6, when the first and second connecting parts are joined together with a split line being disposed therebetween.

FIG. 8 is a plan view of the connecting unit 60 with the first and second connecting parts 62a and 64a being joined together as shown in FIG. 7B, for example, by wave-soldering or reflow-soldering across a split line SL. As shown in FIG. 8, the cable assembly 60 may have eight signal vias in each signal column, and seven ground vias in each ground column, so as to correspond to the conventional VHDM connector assembly as shown in FIG. 2. The connecting unit 60 has two parts, i.e., a right part 62a and a left part 64a, with a split line SL being disposed therebetween. The split line SL extends along a width direction of the connecting unit 60 which is the same as the width direction W of the connector assembly 70a, and passes through the center of ground vias of the ground column.

Each connecting part 62a and 64a has semicircular half vias 620 and 640 (see FIG. 6). When the two connecting parts 62a and 64a are joined, the two half vias 620 and 640 jointly form a via 660, as shown in FIG. 8. A ground pin (not shown) of the VHDM connector assembly 70a can be connected with the circular via 660. In this way, a ground shield (not shown) of the VHDM connector assembly 70a can be connected with the via 660 or other ground vias in the split zone. Thus, The ground vias in the split zone can be connected to the ground shield of the VHDM connector assembly 70a like other ground vias in the remaining portion of the connecting unit 60. Accordingly, a return loop path is provided to a portion of the VHDM connector assembly 70a connected with the split zone similar to all the other portions of the VHDM connector assembly 70a, thereby maintaining SI performances. However, even when no ground pin is inserted into the vias in the split zone, the two connecting parts may be joined together to form a single connecting unit by wave-soldering or reflowing-soldering the vias in the split zone together.

Figure 9A:
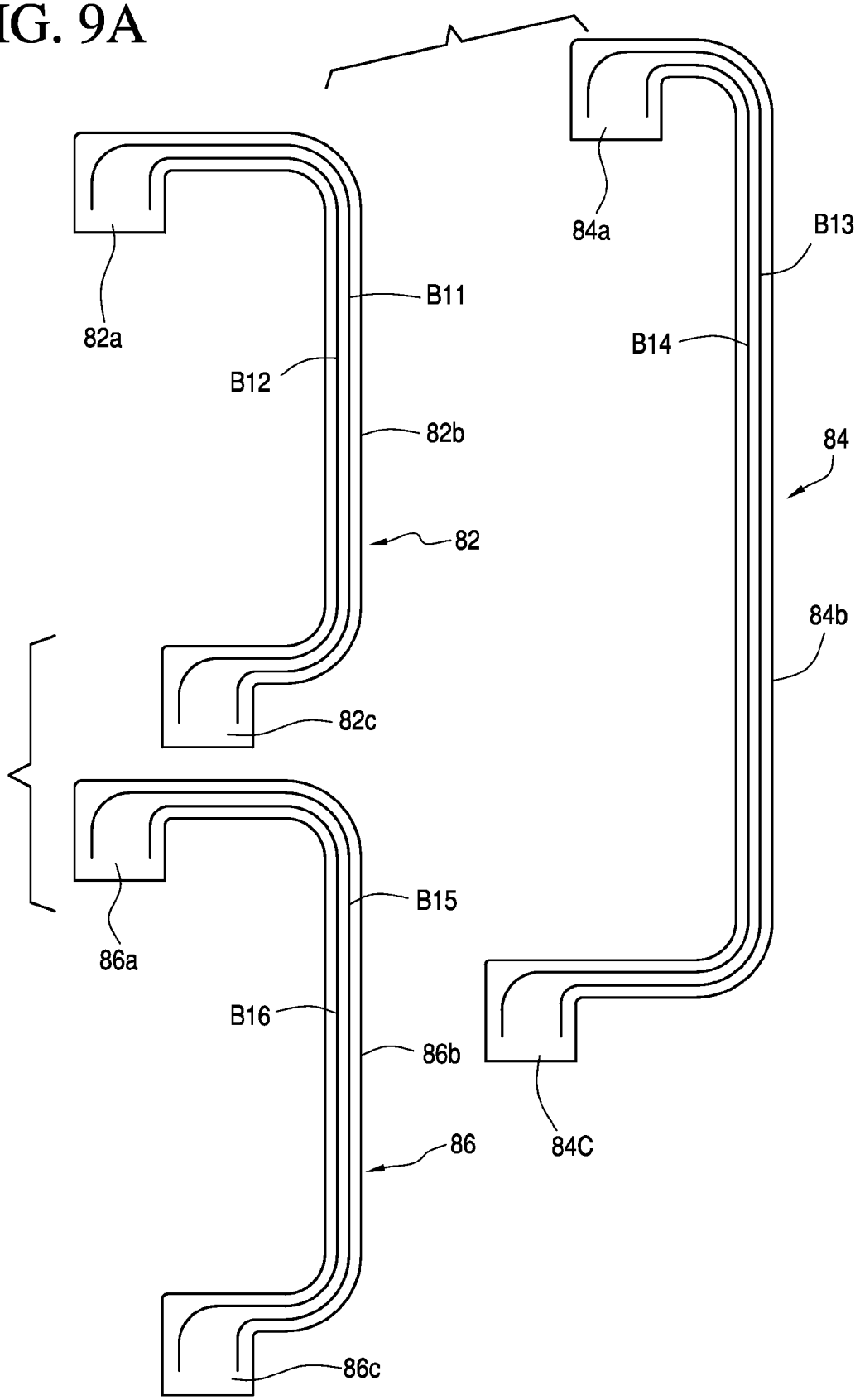
FIGS. 9A and 9B are schematic perspective plan view of a cable assembly for interconnecting a three-drawer system, according to another exemplary embodiment of the present invention.
Figure 9B:
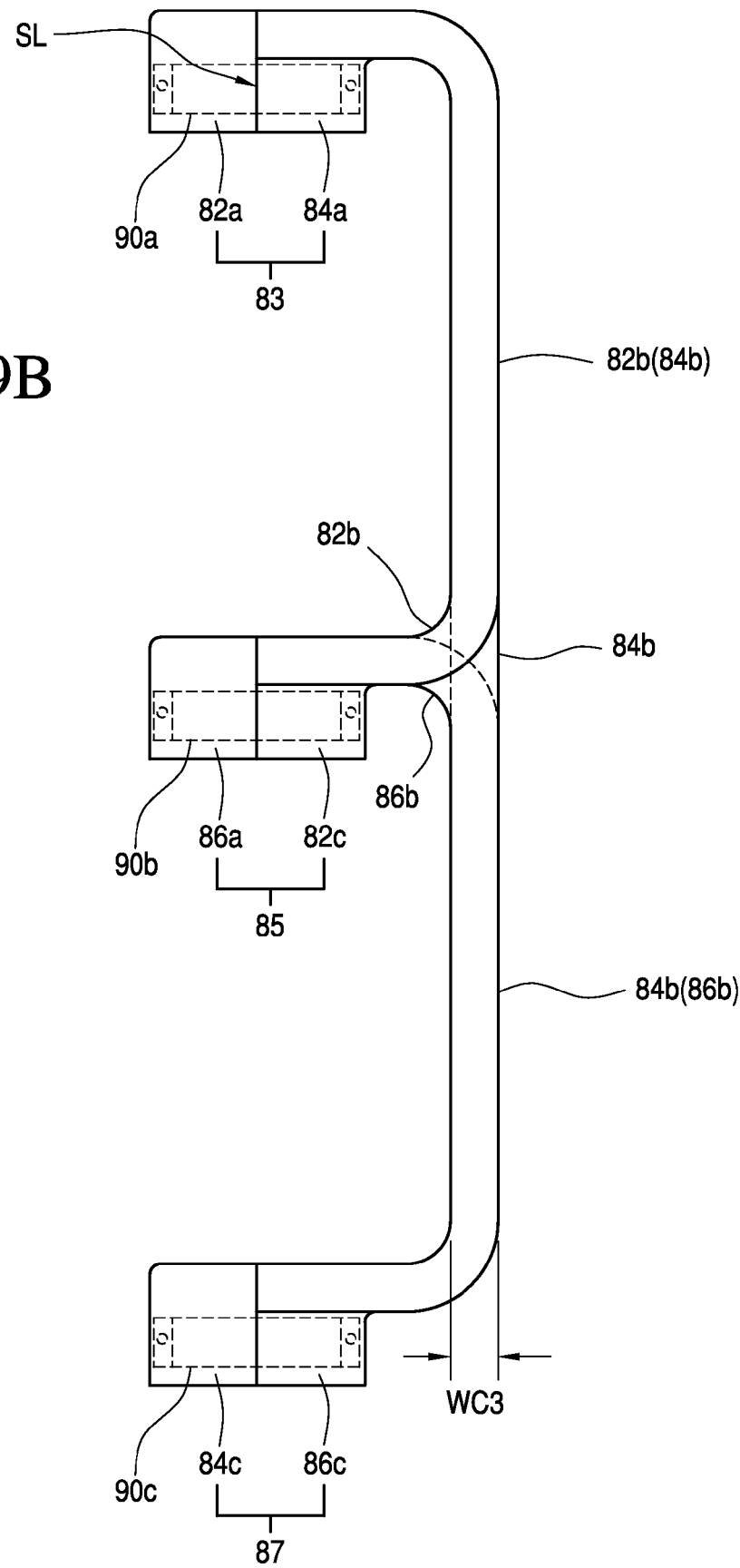

FIGS. 9A and 9B illustrates a cable assembly according to another exemplary embodiment of the invention for interconnecting a three-drawer system. The cable assembly includes three cables 82, 84 and 86. These three cables 82, 84 and 86 collectively interconnect together three circuit boards (not shown) through three connector assemblies 90a, 90b and 90c that are respectively connected to each circuit board. The cables 82, 84 and 86 respectively include a first end part 82a, 84a and 86a, a main cable portion 82b, 84b and 86b, and a second end part 82c, 84c and 86c. The first end parts 82a and 84a of the cables 82 and 84 jointly form a connecting unit 83 connected to the connector assembly 90a. The second end part 82c of the cable 82 and the first end part 86a of the cable 86 jointly form a connecting unit 85 connected to the connector assembly 90b. The second end parts 84c and 86c of the cables 84 and 86 jointly form a connecting unit 87 connected to the connector assembly 90c.

If two buses are required so as to interconnect two circuit boards in the three-drawer system, each cable has two buses (B11, B12), (B13, 14) and (B15, B16), as shown in FIG. 9A. The two buses of each cable may be formed on a single layer, so as to reduce a layer count. Further, as shown in FIG. 9B, the main cable portions 82b, 84b and 86b may have the same width, and can be stacked together in its thickness direction, so as to reduce a width WC3 of the combined cables. However, each cable portion may have a different width. According to this exemplary embodiment of the invention, each set of buses for connecting two circuit boards is disposed in a separate cable. Degradation of the SI performance of the flex cable can be prevented, because a bus in one cable may crossover another bus in another cable without vias. In the conventional cable with multiple layers, a signal line in one layer should cross over another layer through additional vias for such crossover. However, these additional vias also take space, thereby impacting cable routing, cable width or layer count.

Next, a method for fabricating the cable assembly of the invention will be described. The cable assembly may be fabricated by using a flex cable that generally includes signal lines, frame ground domains and logic ground domains. When the flex cable is split into two parts, one part may form the first connecting part 62a of the first cable 62, and the other part may form the second connecting part 64a of the second cable 64, as shown in FIG. 6.

First, the signal lines of the flex cable are wired out of the area of the flex cable to be split.

Second, the frame ground or power domains are pulled back from the edge of the area to be split. These frame grounds are pulled back so that they are not exposed at the split line SL (see FIG. 8) of the cables 62 and 64, thereby preventing a short circuit from occurring between the first and second connecting parts 62a and 64a.

Third, the logic ground domains are pulled back from the edge or the split line SL of the area to be split, or they can extend past the edge of the routed cable leaving exposed ground planes in the split zone. When the half vias of the two connecting parts 62a and 64a are soldered together later, the logic ground domains of the two connecting part are interconnected together. In this case, the logic ground domains of each connecting parts could extend to the half vias of each connecting parts 62a and 64a.

Fourth, the flex cable is cut or split into two or more separate parts through at least one split line that passes through centers of vias, thereby forming, e.g., the first connecting parts 62a and the second connecting parts 64a, each having half vias at each outer periphery. The vias may be ground vias, and accordingly the half vias may be ground half vias. However, the vias may be power vias connected to the power domains or signal vias connected to the signal lines, and thus the half vias may be power half vias or signal half vias.

Fifth, the two or more split separate parts are joined together by aligning. During the joining, the split parts may be laminated onto an FR-4 stiffener.

Finally, the VHDM connector assemblies are attached to the joined separate parts by using conventional processes.

Figure 10:
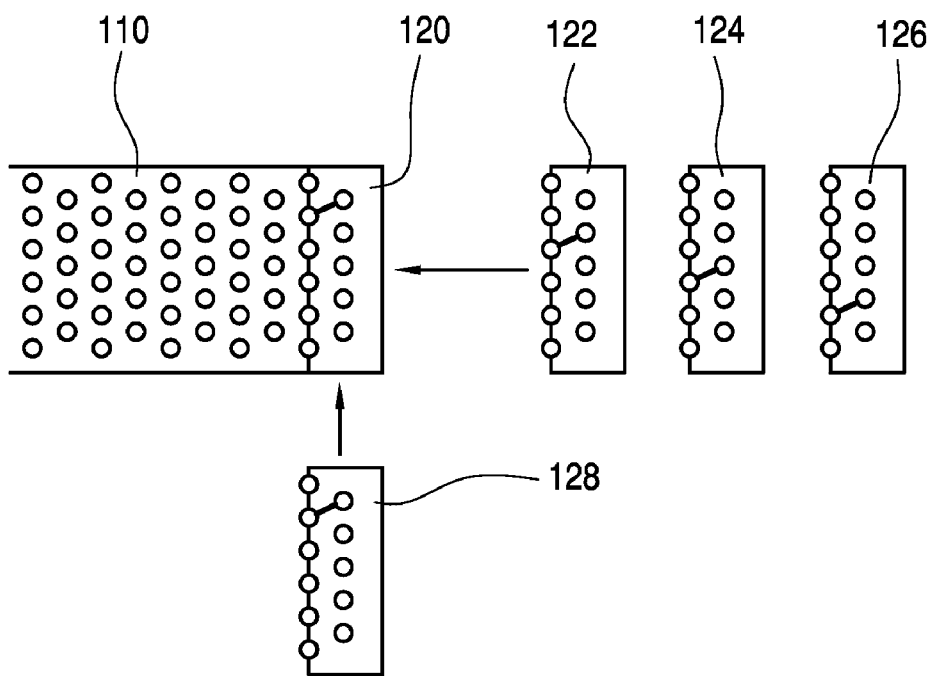
FIG. 10 is a schematic plan view of a connecting part according to a further exemplary embodiment of the present invention.

The cable assembly of the invention enables a customized volume design. Because the connecting unit of the invention can be divided into a plurality of connecting parts, it is possible to set ID bits of the connecting unit or fix a defected area in the connecting unit based on each divided connecting part, without treating the entire connecting unit. As shown in FIG. 10, two connecting parts 110 and 120 are coupled together to form jointly a single connecting unit. ID bits of the connecting unit can be set easily by replacing the part 120 by other connecting parts 122, 124 and 126 each of which has required ID bits. Further, the cable assembly of the invention enables an easy replacement of defective segments, by replacing the connecting part 120, when damaged, with a new connecting part 128.

Figure 11:
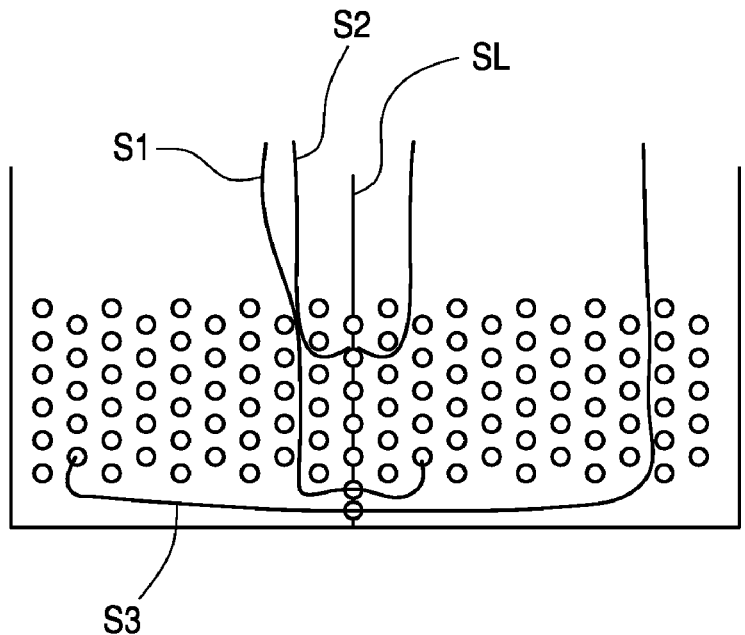
FIG. 11 is a schematic plan view of a connecting part according to a further exemplary embodiment of the present invention.

As shown in FIG. 11, the cable assembly according to another exemplary embodiment of the invention may be configured to run signals S1 to S3 to both sides of the split line SL. Each signal S1 to S3 extends from one connecting part to the other connecting part, crossing over the split line SL e.g., through vias on the split line. The vias may be tied together with solder and disposed in areas without connector assemblies.

Figure 12:
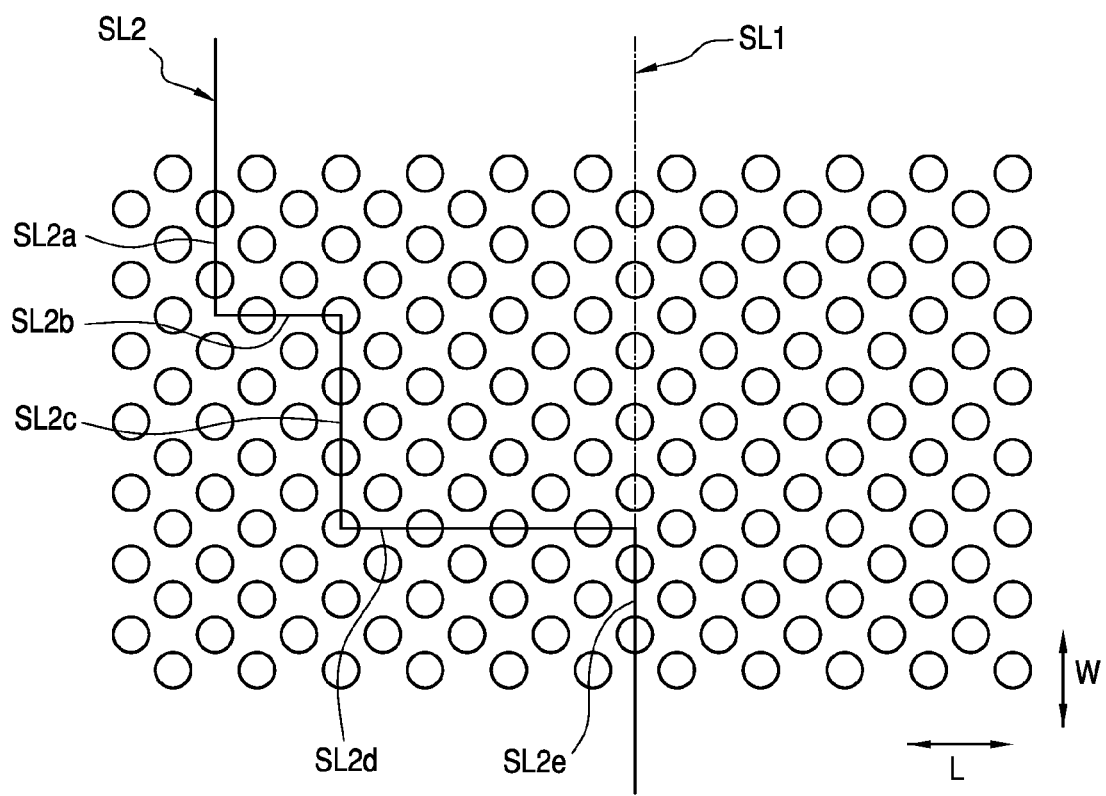
FIGS. 12, 14 and 15 are, respectively, a schematic plan view of a connecting part according to a further exemplary embodiment of the present invention.

As shown in FIG. 12, the cable assembly of the invention may have various split patterns. A split line SL1 of the connecting unit of the cable assembly extends along the width direction of the connector assembly, forming a vertical linear split pattern. The split line SL1 cut through centers of ground vias.

Further, the connecting unit may have an irregular split line SL2. The split line SL2 include sub-lines SL2a to SL2e that collectively form a step shape. However, the split line may be a zigzag shape or other shapes. The sub-lines SL2a, SL2c and SL2e extend along the width direction W of the connector assembly, and collectively divide the connecting unit of the cable assembly into two separate connecting parts with respect to the width direction W. The horizontal sub-lines SL2b and SL2d respectively connect two adjacent vertical sub-lines (SL2a, SL2c) and (SL2c, SL2e), and may extend along the length direction L of the connector assembly.

Further, the split line is not limited to pass through centers of the ground vias. In FIG. 12, the sub-lines SL2b, SL2c and SL2d pass through centers of the signal vias, while the sub-lines SL2a and SL2e pass through centers of the ground vias.

Figure 14:
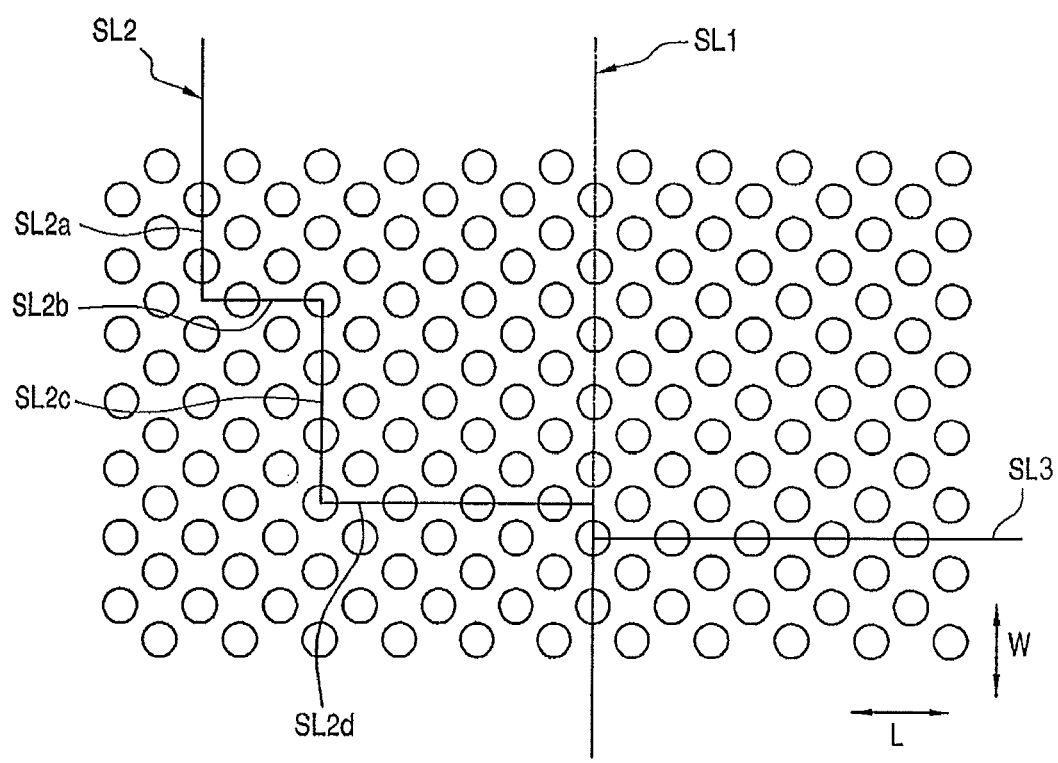
Figure 15:
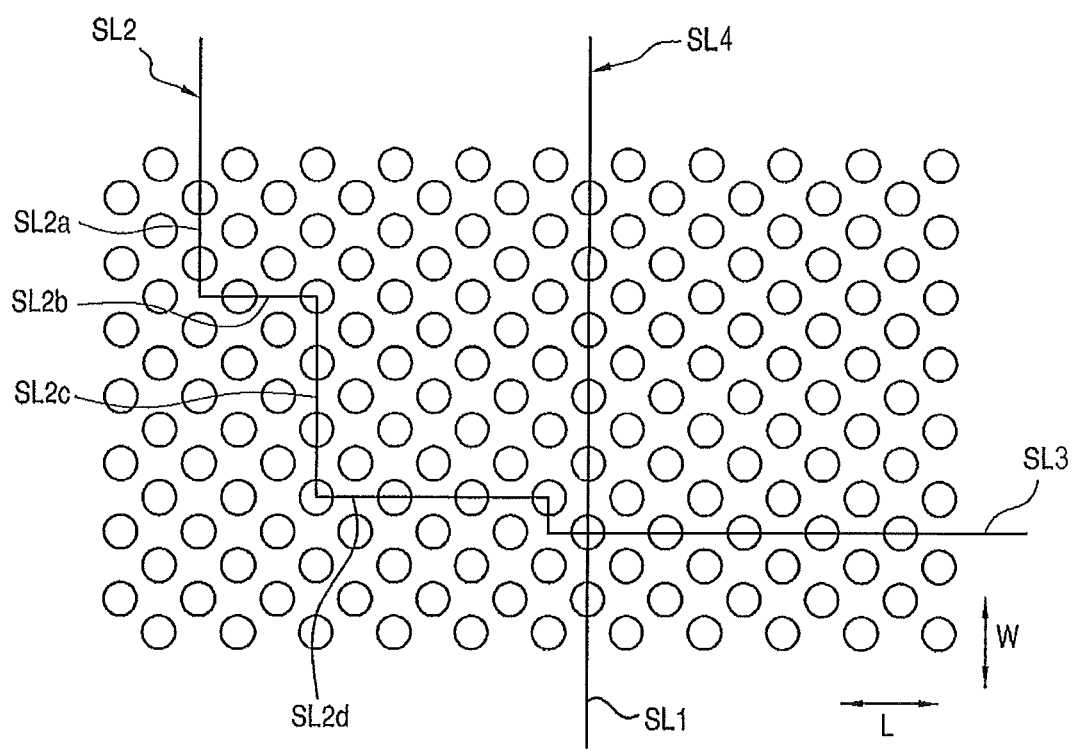

Further, the split line may have an angle other than 180 degree in the vias. In FIG. 12, the split line SL has a 90 degree angle in the via at which the sublines SL2b and SL2c are joined together, as well as in the via at which the sublines SL2c and SL2d are joined together. Further, the vias may be split into three or more sections, allowing the flex cable to be split into three or more sections accordingly, thereby increasing the design flexibility. For example, a via may be split into three sections by split lines SL1 and SL3 as shown in FIG. 14, and a via may be split into four sections by split lines SL1, SL2, SL3 and SL4 with each section having cut by 90 degrees as shown in FIG. 15.

Figure 13:
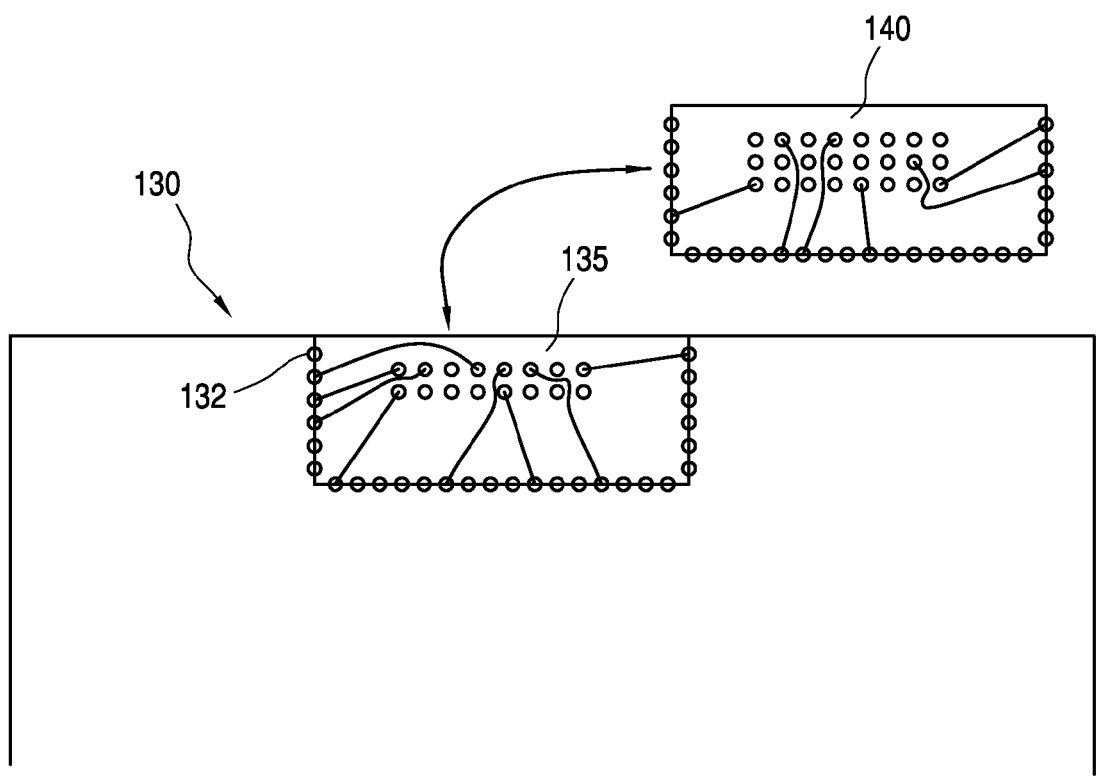
FIG. 13 is a schematic plan view of a circuit board according to a further exemplary embodiment of the present invention.

According to another exemplary embodiment of the invention, a circuit board connected to the connector assembly may be split into two or more segments. FIG. 13 illustrates a circuit board 130 to be connected with a connector assembly. So as to be connected with two different connector assemblies (not shown) with the same or similar signals, the circuit board 130 may include two unique segments 135 and 140. The segment 135 may be configured to correspond to a first connector assembly (not shown), whereas the segment 140 may be configured to correspond to a second connector assembly (not shown). The segment 135 or 140 of the circuit board 130 can be selected depending upon the corresponding connector assembly. Further, the segments may be formed by cutting through centers of vias 132 of the circuit board. The vias 132 interconnect together the circuit board 130 and the segments 135 or 140.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings. It will be understood that the above description of the preferred embodiments of the present invention are susceptible to various modifications, changes, and adaptations, and the same are intended to be comprehended within the meaning and range of equivalents of the appended claims.

What is claimed is:

1. A cable assembly for interconnecting a plurality of circuit boards together by using a connector assembly connected to each of the circuit boards, the connector assembly having a plurality signal pins and a plurality of ground pins disposed in a plurality of columns, each column extending in a width direction of the connector assembly, the cable assembly comprising:
   a first cable having a first end part connected to the connector assembly, the first end part having vias for receiving the signal pins and the ground pins, the vias being disposed to correspond to various ones of the signal pins and the ground pins, a first periphery of the first end part having a portion that has a plurality of first half vias that collectively form a column along the width direction of the connector assembly; and
   a second cable having a second end part connected to the connector assembly, the second end part having vias for receiving the signal pins and the ground pins, the vias of the second end part being disposed to correspond to various other ones of the signal pins and ground pins, a second periphery of the second end part having a portion that has a plurality of second half vias that collectively form a column along the width direction of the connector assembly,
   wherein the first periphery of the first end part and the second periphery of the second end part are coupled together, such that the first half vias and the second half vias are joined together to form full vias.

2. The cable assembly of claim 1, wherein the first cable includes a main cable portion extending from the first end part, and a further end part extending from the main cable portion.

3. The cable assembly of claim 2, wherein the second cable includes a main cable portion extending from the second end part, and a further end part extending from the main cable portion.

4. The cable assembly of claim 3, wherein the first cable includes a different number of layers from the second cable.

5. The cable assembly of claim 3, wherein the first cable includes the same number of layers as the second cable.

6. The cable assembly of claim 3, wherein the main cable portion of the first cable has the same width as the main cable portion of the second cable.

7. The cable assembly of claim 3, wherein the main cable portions of the first and second cables are stacked together in a thickness direction of the main cable portions.

8. The cable assembly of claim 1, wherein the connector assembly is a VHDM connector assembly.

9. The cable assembly of claim 1, wherein:
   the vias include signal vias for receiving the signal pins and ground vias for receiving the ground pins;
   the signal vias form a plurality of signal columns, each column extending in the width direction of the connector assembly;
   the ground vias form a plurality of ground columns, each column extending in the width direction of the connector assembly; and
   the full vias receive the ground pins.

10. The cable assembly of claim 1, wherein the first periphery of the first end part and the second periphery of the second end part are coupled together, so as to form a line that passes through centers of the full vias along the width direction of the connector assembly.

11. The cable assembly of claim 1, wherein:
   the vias include signal vias for receiving the signal pins and ground vias for receiving the ground pins;
   the signal vias form a plurality of signal columns, each column extending in the width direction of the connector assembly;
   the ground vias form a plurality of ground columns, each column extending in the width direction of the connector assembly; and
   the full vias receive the signal pins.

12. The cable assembly of claim 1, wherein:
   the first periphery of the first end part has a further portion that has a plurality of third half vias that collectively form a row along a length direction of the connector assembly;
   the second periphery of the second end part has a further portion that has a plurality of fourth half vias that collectively form a row along a length direction of the connector assembly; and
   the third half vias and the fourth half vias are joined together to form further full vias.

13. The cable assembly of claim 12, wherein the first periphery of the first end part and the second periphery of the second end part are coupled together so as to form a line therebetween, the line including a first portion that passes through centers of the full vias formed by the first and second half vias along the width direction of the connector assembly, and a second portion that passes through centers of the full vias formed by the third and fourth half vias along the length direction of the connector assembly.

14. The cable assembly of claim 1, further comprising at least one further cable, said at least one further cable having an end part, the end part having vias for receiving the signal pins and the ground pins, the vias being disposed to correspond to the signal pins and ground pins, a periphery of an end of said at least one further cable having a portion that has a plurality of half vias that collectively form a column along the width direction of the connector assembly, and
   wherein the end part of said at least one further cable and the first and second cables are coupled together, such that half vias of two adjacent end parts are joined together to form full vias.

15. A cable assembly for interconnecting a plurality of circuit boards together through a connector assembly connected to a circuit board, the connector assembly having a plurality signal pins and a plurality of ground pins disposed in a plurality of columns, each column extending in a width direction of the connector assembly, the cable assembly comprising:
   a connecting portion connected to the connector assembly, the connecting portion having signal vias for receiving the signal pins and ground vias for receiving the ground pins, the signal vias and the ground vias being disposed to correspond to the signal pins and the ground pins, the connecting portion being split into at least two parts including a first connecting part and a second connecting part, the at least two part being connected to the same connector assembly;

a first cable portion connected to the first connecting part; and a second cable portion connected to the second connecting part, wherein:

at least one of the signal vias or the ground vias is divided into two or more sections, with the two or more divided sections being disposed collectively to form a full via.

16. The cable assembly of claim 15, further including a third connecting part extended from the first cable portion and connected to a further connector assembly, and wherein the first cable portion and the first and third connecting parts collectively form a first cable.

17. The cable assembly of claim 16, further including a fourth connecting part extended from the second cable portion and connected to the further connector assembly, and wherein the second cable portion and the second and fourth connecting parts collectively form a second cable separable from the first cable.

18. The cable assembly of claim 15, wherein the cable assembly is a flex cable.

19. The cable assembly of claim 15, wherein the connector assembly is a VHDM connector assembly.

20. The cable assembly of claim 15, wherein:

the signal vias form a plurality of signal columns, and the ground vias form a plurality of ground columns;

each of the signal and ground columns extends in the width direction of the connector assembly; and the connecting portion is split such that at least one of the ground columns is divided into two regions, one region being included in the first connecting part, the other region being included in the second connecting part.

21. The cable assembly of claim 15, wherein:

the signal vias form a plurality of signal columns, and the ground vias form a plurality of ground columns including a first ground column and a second ground column;

each of the signal and ground columns extends in the width direction of the connector assembly; and the connecting portion is split along a split line including a first portion, a second portion and a third portion, the first portion passing through centers of the vias of the first ground column, the second portion passing through centers of the vias of the second ground column, the third portion interconnecting the first and second portions.

22. The cable assembly of claim 15, wherein:

the signal vias form a plurality of signal columns, and the ground vias form a plurality of ground columns including a first ground column and a second ground column;

each of the signal and ground columns extends in the width direction of the connector assembly;

the connecting portion is split along a split line; and at least one of the signal vias or the ground vias is divided into three or more sections by the split line.

* * * * *